(12) United States Patent
Yamada et al.

(10) Patent No.: US 11,230,668 B2
(45) Date of Patent: Jan. 25, 2022

(54) ETCHANT

(71) Applicant: MITSUBISHI GAS CHEMICAL COMPANY, INC., Chiyoda-ku (JP)

(72) Inventors: Youzou Yamada, Katsushika-ku (JP); Toshiyuki Goto, Chiyoda-ku (JP)

(73) Assignee: MITSUBISHI GAS CHEMICAL COMPANY, INC., Chiyoda-ku (JP)

(*) Notice: Subject to any disclaimer, the term of this patent is extended or adjusted under 35 U.S.C. 154(b) by 0 days.

(21) Appl. No.: 16/971,926

(22) PCT Filed: Mar. 26, 2018

(86) PCT No.: PCT/JP2018/012045
§ 371 (c)(1),
(2) Date: Aug. 21, 2020

(87) PCT Pub. No.: WO2019/186624
PCT Pub. Date: Oct. 3, 2019

(65) Prior Publication Data
US 2021/0095207 A1  Apr. 1, 2021

(51) Int. Cl.
*H01L 21/00* (2006.01)
*H01L 27/00* (2006.01)
(Continued)

(52) U.S. Cl.
CPC ........ *C09K 13/08* (2013.01); *H01L 21/47635* (2013.01); *H01L 27/1225* (2013.01); *H01L 29/41733* (2013.01); *H01L 29/7869* (2013.01)

(58) Field of Classification Search
CPC ........ H01L 21/32134; H01L 21/47635; H01L 21/02565; H01L 21/02554; H01L 27/1225;
(Continued)

(56) References Cited

U.S. PATENT DOCUMENTS

| 4,608,091 A | 8/1986 | Sullivan et al. |
| 4,746,369 A | 5/1988 | Sullivan et al. |

(Continued)

FOREIGN PATENT DOCUMENTS

| CN | 103060805 A | 4/2013 |
| JP | 58-123878 A | 7/1983 |

(Continued)

OTHER PUBLICATIONS

Morita, S. et al., "Amorphous Oxide Semiconductor Adopting Back-channel-etch Type Thin-film Transistor," Kobe Steel Engineering Reports, vol. 65, No. 2, Sep. 2015, pp. 72-77.

(Continued)

*Primary Examiner* — Nikolay K Yushin
(74) *Attorney, Agent, or Firm* — Oblon, McClelland, Maier & Neustadt, L.L.P.

(57) ABSTRACT

The present invention provides an etchant less causing damage to IGZOs. The etchant of the present invention comprises hydroxyethanediphosphonic acid (A), one or more phosphonic acids (B), hydrogen peroxide (C), nitric acid (D), a fluorine compound (E), an azole (F), and an alkali (G), and is characterized in that the phosphoric acids (B) comprise one or more phosphonic acids selected from the group consisting of diethylenetriaminepentamethylenephosphonic acid, N,N,N',N'-ethylenediaminetetrakismethylenephosphonic acid, and aminotrimethylenephosphonic acid and that the proportion of the hydroxyethanediphosphonic acid (A) is in the range of 0.01-0.1 mass % and the proportion of the phosphonic acids (B) is in the range of 0.003-0.04 mass %.

19 Claims, 2 Drawing Sheets

(51) Int. Cl.
*H01L 29/00* (2006.01)
*C09K 13/08* (2006.01)
*H01L 21/4763* (2006.01)
*H01L 27/12* (2006.01)
*H01L 29/417* (2006.01)
*H01L 29/786* (2006.01)

(58) Field of Classification Search
CPC .............. H01L 27/124; H01L 27/1288; H01L 27/3262; H01L 27/127; H01L 29/7869; H01L 29/66969; H01L 29/41733; H01L 29/78696; C09K 13/08; C09K 13/06; C09K 13/04; C09K 13/10; C23F 1/18; C23F 1/02; C23F 1/30; C23F 1/26; C23F 1/16; C23F 1/10
See application file for complete search history.

(56) References Cited

U.S. PATENT DOCUMENTS

| | | | | |
|---|---|---|---|---|
| 8,211,844 | B2* | 7/2012 | Sharma | H01L 21/32138 510/175 |
| 9,422,512 | B2* | 8/2016 | Shimada | C11D 3/3947 |
| 10,301,581 | B2* | 5/2019 | Aoyama | C11D 3/3947 |
| 2004/0262569 | A1* | 12/2004 | Cho | H01L 21/32134 252/79.1 |
| 2005/0176602 | A1* | 8/2005 | Hsu | C23G 1/061 510/175 |
| 2010/0159624 | A1* | 6/2010 | Cho | H01L 21/32134 438/34 |
| 2015/0210966 | A1* | 7/2015 | Shimada | H01L 21/0337 438/703 |
| 2017/0101607 | A1* | 4/2017 | Aoyama | C11D 3/044 |

FOREIGN PATENT DOCUMENTS

| | | |
|---|---|---|
| JP | 2016-108659 A | 6/2016 |
| JP | 2016-111342 A | 6/2016 |
| KR | 10-2015-0114654 A | 10/2015 |
| TW | 201207952 A1 | 2/2012 |
| WO | WO 2017/188108 A1 | 2/2017 |

OTHER PUBLICATIONS

International Search Report dated Jun. 19, 2018 in PCT/JP2018/012045 filed on Mar. 26, 2018, 2 pages.

* cited by examiner

ETCHANT

TECHNICAL FIELD

The present invention relates to semiconductor technology, and particularly relates to a protective solution for IGZO and an etchant.

BACKGROUND ART

With respect to oxide semiconductor materials, indium gallium zinc oxide (IGZO) has been examined as a useful material. However, it has been known that there is a problem that since IGZO is easily etched by an acid or alkali, when a source-drain wiring is formed using such etchants, IGZO serving as a base is corroded.

In order to cope with this, an etching stopper type structure, wherein a protective layer is formed on IGZO and then a source-drain wiring is formed (see FIG. 1), is conventionally employed, but the production thereof is complicated, resulting in increase in the cost. For this reason, it has been desired to develop an etchant which enables etching of wiring materials while suppressing damage to IGZO in order to employ a back-channel-etch type structure in which no protective layer is required (see FIG. 2) (see Non-Patent Literature 1).

Further, recently, resolution enhancement of panels typified by 4K and 8K panels has been rapidly promoted. When resolution enhancement of panels is promoted, wiring patterns for driving pixels become dense, but in order to suppress the loss of light irradiated from a backlight, processing must be carried out to provide a small wiring width. Meanwhile, in order to ensure the amount of the current flowing in a wiring, processing must be carried out to provide a high wiring for obtaining a larger cross-sectional area of wiring. Specifically, it is desired to develop an etchant which enables processing for providing a wiring having a high taper angle.

Currently, as an etchant which suppresses damage to IGZO, the etchant described in Japanese Laid-Open Patent Publication No. JP2016-111342A (Patent Literature 1), which is characterized in that it has a low pH, is known, but sufficient corrosion protection performance for IGZO and processability cannot be achieved thereby.

CITATION LIST

Patent Literature

Patent Literature 1: Japanese Laid-Open Patent Publication No. JP2016-111342A

Non-Patent Literature

Non-Patent Literature 1: Kobe Steel Engineering Reports Vol. 65, No. 2, Sep. 2015, Shinya Morita et al., "Oxide semiconductor material compatible with BCE type TFT"

SUMMARY OF INVENTION

Technical Problem

Under the above-described circumstances, it is desired to provide an etchant which enables etching of wiring materials while suppressing damage to IGZO.

Solution to Problem

The present invention is as described below.
[1] An etchant comprising hydroxyethanediphosphonic acid (A), a phosphonic acid (B), hydrogen peroxide (C), nitric acid (D), a fluorine compound (E), an azole (F) and an alkali (G), wherein: the phosphonic acid (B) comprises at least one phosphonic acid selected from the group consisting of diethylenetriaminepentamethylenephosphonic acid, N,N,N', N'-ethylenediaminetetrakismethylenephosphonic acid and aminotrimethylenephosphonic acid; the ratio of the hydroxyethanediphosphonic acid (A) is 0.01 to 0.1% by mass; and the ratio of the phosphonic acid (B) is 0.003 to 0.04% by mass.

[2] The etchant according to item [1], wherein the phosphonic acid (B) is diethylenetriaminepentamethylenephosphonic acid.

[3] The etchant according to item [1] or [2], wherein the fluorine compound (E) is ammonium fluoride or ammonium acid fluoride.

Advantageous Effect of Invention

According to a preferred embodiment of the present invention, by using the etchant of the present invention, the corrosion of IGZO by acids and bases can be prevented, and it is not required to form a protective layer on IGZO, and for this reason, the production cost can be significantly reduced. Therefore, in the etching process, a satisfactory substrate having a wiring structure with a high taper angle can be prepared while preventing the corrosion of IGZO. In particular, a particularly preferred etching process can be applied to a structure having a multilayer thin film including a copper layer and a titanium layer on IGZO.

DESCRIPTION OF EMBODIMENTS

Figure 1:
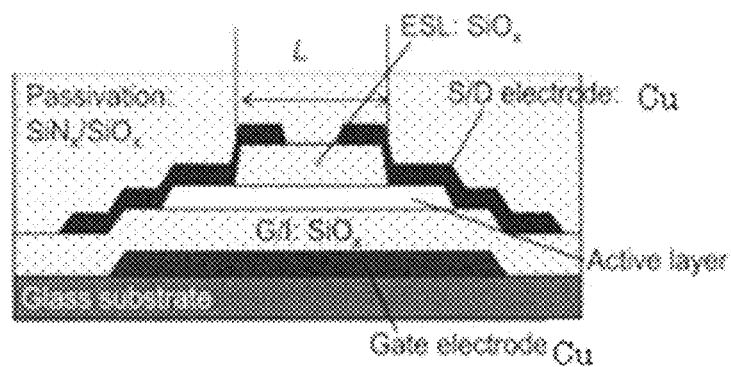
FIG. 1 is an example of a schematic view of a TFT having a conventional etching stopper type structure in which a protective layer is provided on IGZO.
Figure 2:
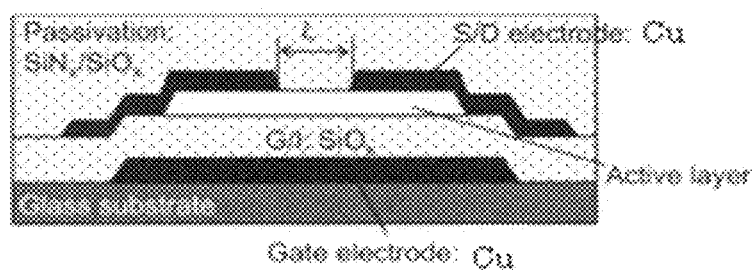
FIG. 2 is an example of a schematic view of a TFT having a back-channel-etch type structure in which no protective layer is provided.

The etchant of the present invention can have corrosion protection performance for IGZO by including hydroxyethanediphosphonic acid (A) and a specific phosphonic acid (B). Further, by further including hydrogen peroxide (C), nitric acid (D), a fluorine compound (E), an azole (F) and an alkali (G), a composition which enables etching of a wiring material while having corrosion protection performance for IGZO can be obtained.

Hereinafter, respective components of the etchant of the present invention will be described in detail.

[Hydroxyethanediphosphonic Acid (HEDP) (A)]

The hydroxyethanediphosphonic acid (A) is a compound represented by formula (1).

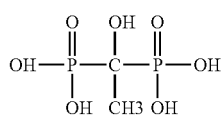

(1)

The ratio of HEDP (A) in the etchant is 0.01 to 0.1% by mass, and preferably 0.03 to 0.08% by mass. When the concentration of HEDP (A) is within the above-described range, high corrosion protection performance for IGZO can be imparted, and surface roughness of IGZO can be prevented.

[Phosphonic Acid (B)]

By using the phosphonic acid (B) in combination with HEDP (A), high corrosion protection performance for IGZO can be imparted, and at the same time, a wiring form can be processed to have a high taper angle.

In the present invention, the phosphonic acid (B) is at least one phosphonic acid selected from the group consisting of diethylenetriaminepentamethylenephosphonic acid, N,N,N',N'-ethylenediaminetetrakismethylenephosphonic acid and aminotrimethylenephosphonic acid. Among them, N,N,N',N'-ethylenediaminetetrakismethylenephosphonic acid is preferred because it has high corrosion protection performance for IGZO.

The ratio of the phosphonic acid (B) in the etchant is 0.003 to 0.04% by mass, preferably 0.01 to 0.03% by mass, and more preferably 0.015 to 0.03% by mass. When the concentration of the phosphonic acid (B) is within the above-described range, high corrosion protection performance for IGZO can be achieved.

[Hydrogen Peroxide (C)]

The hydrogen peroxide (C) serves as an oxidant and has the function to oxidize copper.

The ratio of the hydrogen peroxide (C) in the etchant is preferably 4.0 to 8.0% by mass, more preferably 4.5 to 7.5% by mass, and particularly preferably 5.0 to 6.5% by mass. When the concentration of the hydrogen peroxide (C) is within the above-described range, securing the etching rate and suppressing local corrosion of a wiring can be suitably carried out.

[Nitric Acid (D)]

The nitric acid (D) has the effect of dissolving copper oxidized by hydrogen peroxide, etc.

The ratio of the nitric acid (D) in the etchant is preferably 0.8 to 7.0% by mass, more preferably 1.5 to 6.5% by mass, and particularly preferably 2.0 to 6.0% by mass. When the concentration of the nitric acid (D) is within the above-described range, a satisfactory etching rate can be secured, and a satisfactory wiring form can be obtained.

[Fluorine Compound (E)]

The fluorine compound (E) has the function to provide etching of a barrier layer made of a titanium-based metal.

The type of the fluorine compound (E) is not limited as long as it generates fluorine ions. Specific examples thereof include hydrofluoric acid, ammonium fluoride and ammonium acid fluoride, and among them, ammonium fluoride and ammonium acid fluoride are preferred because these have low toxicity. As the fluorine compound (E), such materials may be used solely, or two or more of them may be used in combination.

The ratio of the fluorine compound (E) in the etchant is preferably 0.2 to 0.8% by mass, more preferably 0.2 to 0.6% by mass, and particularly preferably 0.2 to 0.5% by mass. When the concentration of the fluorine compound (E) is within the above-described range, a satisfactory etching rate for the barrier layer made of the titanium-based metal can be obtained.

[Azole (F)]

The azole (F) is used for adjusting the etching rate by pH. Specific examples of the azole (F) include: triazoles such as 1,2,4-triazole, 1H-benzotriazole, 5-methyl-1H-benzotriazole and 3-amino-1H-triazole; tetrazoles such as 1H-tetrazole, 5-methyl-1H-tetrazole, 5-phenyl-1H-tetrazole and 5-amino-1H-tetrazole; and thiazoles such as 1,3-thiazole and 4-methylthiazole. Among them, tetrazoles are preferred, and 5-amino-1H-tetrazole is particularly preferred on the point that it does not form an insoluble salt with copper ions in the solution. As the azole (F), such materials may be used solely, or two or more of them may be used in combination.

The ratio of the azole (F) in the etchant is preferably 0.05 to 0.35% by mass, more preferably 0.05 to 0.30% by mass, and particularly preferably 0.08 to 0.25% by mass. When the concentration of the azole (F) is within the above-described range, the etching rate can be suitably adjusted, and a satisfactory wiring form can be obtained.

[Alkali (G)]

The alkali (G) is used for adjusting the etching rate by pH. The type of the alkali (G) is not limited as long as it is usually used as an etchant, and examples thereof include ammonia, potassium hydroxide, quaternary ammonium hydroxide and an amine compound.

Examples of the amine compound include: alkylamines such as ethylamine and isopropylamine; alkanolamines typified by N-propanolamine and N-methylethanolamine; and diamines typified by ethylenediamine. Among them, quaternary ammonium hydroxide, N-propanolamine and N-butylethanolamine are preferred on the point that these materials do not deteriorate stability of hydrogen peroxide. As the alkali (G), such materials may be used solely, or two or more of them may be used in combination.

The ratio of the alkali (G) in the etchant is preferably 0.6 to 10% by mass, more preferably 1.0 to 9.0% by mass, and particularly preferably 2.0 to 8.0% by mass. When the concentration is within the above-described range, the etching rate can be suitably adjusted.

[Other Components]

The etchant of the present invention may contain an additive, a hydrogen peroxide stabilizer, a surfactant, a coloring agent, a defoaming agent and the like that are conventionally used for etchants within a range in which the purpose of the present invention is not impaired.

[Method for Preparing Etchant]

The etchant of the present invention is prepared by adding water (preferably ultrapure water) to HEDP (A), the phosphonic acid (B), the hydrogen peroxide (C), the nitric acid (D), the fluorine compound (E), the azole (F), the alkali (G), and according to need, other components and stirring the mixture until it becomes homogeneous.

The range of the pH of a liquid composition is not particularly limited, but the pH is usually 1.5 to 2.8, and preferably 1.8 to 2.5. When the pH is within the above-described range, a wiring material can be etched while suitably preventing the corrosion of IGZO.

[Method for Using Etchant]

An object can be etched by bringing the object into contact with the etchant of the present invention.

The method for bringing the object into contact with the etchant of the present invention is not particularly limited. For example, it is possible to employ a method of bringing the object into contact with the etchant by means of dropping (single wafer spin process), spray or the like, a method of immersing the object in the etchant of the present invention, or the like.

The temperature range for use of the etchant of the present invention is usually 10 to 70° C., and preferably 20 to 50° C. The time for use of the etchant is usually 0.2 to 60 minutes. As a rinse liquid to be used after etching, either an organic solvent or water may be used.

[Semiconductor Substrate]

A substrate to be targeted by the etchant of the present invention preferably has IGZO, and IGZO is not particularly limited as long as it is a semiconductor comprising indium, gallium, zinc and oxygen. The above-described oxide may have either an amorphous structure or crystallizability.

When using IGZO, for example, as an electronic element such as a thin film transistor (TFT), IGZO is formed on a substrate such as glass using a film forming process such as a sputtering method. Next, etching is carried out using a resist or the like as a mask, thereby forming an electrode pattern. Further, copper (Cu), titanium (Ti), etc. are formed thereon using a film forming process such as a sputtering method, and then etching is carried out using a resist or the like as a mask, thereby forming a source/drain electrode.

Figure 3:
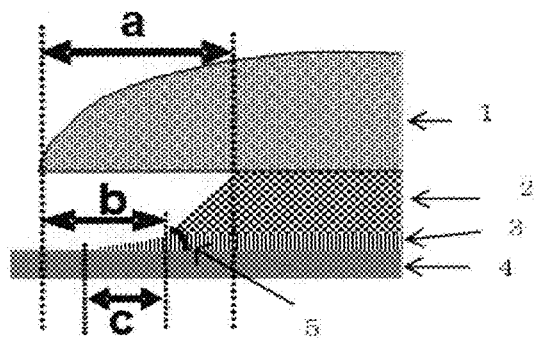
FIG. 3 is an example of a schematic view of a cross-sectional surface of a wiring when using the etchant of the present invention.

FIG. 3 is an example of a schematic view of a cross-sectional surface of a wiring when using the etchant of the present invention. The multilayer thin film structure as shown in FIG. 3, which has a wiring layer (2) consisting of a copper layer containing copper on a IGZO layer (4), wherein a barrier layer (3) that is a titanium layer containing titanium or the like is interposed therebetween, is preferred to be used for wirings of display devices such as flat panel displays, etc., and the performance of the etchant of the present invention is particularly effectively exerted in this case. According to a preferred embodiment of the present invention, by etching this multilayer thin film using a resist layer (1) as a mask and using the etchant of the present invention, a desired wiring structure can be formed. In FIG. 3, [the distance (a) from the edge of the resist layer (1) to the edge of the wiring layer (2) that is in contact with the resist layer (1)]×2 is referred to as a top CD loss (a×2), and [the distance (b) from the edge of the resist layer (1) to the edge of the wiring layer (2) that is in contact with the barrier layer (3) provided below the wiring layer (2)]×2 is referred to as a bottom CD loss (b×2). Further, [the distance (c) from the edge of the wiring layer (2) to the edge of the barrier layer (3)]×2 (C×2) is referred to as a tailing, and the angle between the etching surface of the edge of the wiring layer (2) and the IGZO layer (4) below is referred to as a taper angle (5).

EXAMPLES

Hereinafter, the present invention will be specifically described based on working examples, but embodiments can be suitably changed within a range in which the effects of the present invention are exerted.

Note that "%" means "% by mass" unless otherwise specified.

[Substrates for Evaluation]

<Substrate (1) for Evaluation of Etching Rate and Surface Condition of IGZO>

IGZO, in which the element ratio between indium (In), gallium (Ga), zinc (Zn) and oxygen (O) is 1:1:1:4, having a film thickness of 1000 Å (100 nm) was formed on a glass substrate using a sputtering method (100 mm×100 mm×1 mm).

<Substrate (2) for Evaluation of Etching Performance with Respect to Multilayer Thin Film Including Copper Layer and Titanium Layer>

On a glass substrate, titanium was sputtered with a thickness of 25 nm to form a titanium layer, and then copper was sputtered with a thickness of 600 nm to form a copper layer of a wiring material. Next, a resist was applied, a pattern mask was exposed to light and transferred, and then development was carried out to form a wiring pattern, thereby preparing a multilayer thin film including the copper layer and the titanium layer on the glass substrate (100 mm×100 mm×1 mm).

[Evaluation Methods]

[Etching Rate (E.R. (Å/Sec)) of IGZO]

A composition in which respective concentrations of components (C), (D), (E), (F) and (G) were as described in Table 1 or 2 was prepared, then 6000 ppm of copper powder and 150 ppm of titanium powder were respectively added thereto, and the mixture was stirred until the metals were dissolved. After it was confirmed that the metals were dissolved, components (A) and (B) were added thereto at predetermined concentrations, thereby providing an etchant. The substrate (1) was allowed to stand and immersed in each etchant at 35° C. for 20 seconds to perform etching. After that, it was washed with water and then dried with nitrogen gas.

The film thickness after etching was measured using n&k Analyzer 1280 (n&k Technology Inc.), and the etching rate was calculated by dividing the film thickness difference by the etching time. Judgment was carried out based on the below-described criteria.

E: the etching rate was lower than 5 Å/sec
G: the etching rate was 5 Å/sec or higher but lower than 8 Å/sec
P: the etching rate was 8 Å/sec or higher but lower than 10 Å/sec
B: the etching rate was 10 Å/sec or higher
E, G and P were regarded as acceptable.

[Surface Condition of IGZO]

The thin film of IGZO after the measurement of the etching rate of IGZO was cut, and the surface condition (roughness) was observed using a scanning electron microscope (model number: S5000H, manufactured by Hitachi, Ltd., 50000×) (accelerating voltage: 2 kV, accelerating current: 10 μA), and judgment was carried out based on the below-described criteria.

E: the surface was smooth
G: slight surface roughness was generated, when the cross section of IGZO was observed using the scanning electron microscope, the difference between the concave portion and the convex portion was less than 25 nm, or when the surface of IGZO was observed using the scanning electron microscope, the number of void portions generated per unit area (1200 nm×1200 nm) was less than 20
B: significant surface roughness and voids were generated, when the cross section of IGZO was observed using the scanning electron microscope, the difference between the concave portion and the convex portion was 25 nm or more, or when the surface of IGZO was observed using the scanning electron microscope, the number of void portions generated per unit area (1200 nm×1200 nm) was 20 or more
E and G were regarded as acceptable.

Figure 4:
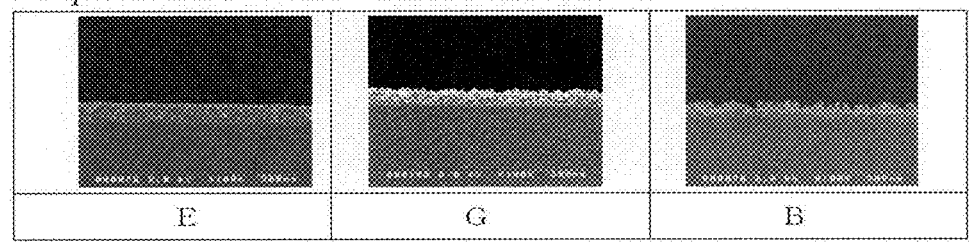
FIG. 4 shows examples of observation of the cross section of IGZO when using the etchant in the Examples or Comparative Examples.
Figure 5:
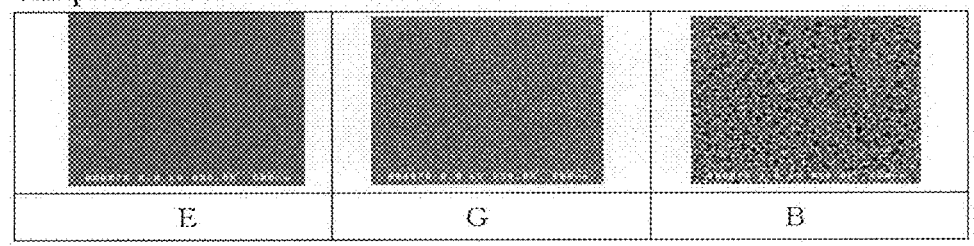
FIG. 5 shows examples of observation of the surface of IGZO when using the etchant in the Examples or Comparative Examples.

Samples of observation of the cross section of IGZO are shown in FIG. 4, and samples of observation of the surface are shown in FIG. 5.

[Etching Performance with Respect to Multilayer Thin Film Including Copper Layer and Titanium Layer]

A composition in which respective concentrations of components (C), (D), (E), (F) and (G) were as described in Table 1 or 2 was prepared, then 6000 ppm of copper powder and 150 ppm of titanium powder were respectively added thereto, and the mixture was stirred until the metals were dissolved. After it was confirmed that the metals were dissolved, components (A) and (B) were added thereto at predetermined concentrations, thereby providing an etchant. The substrate (2) was allowed to stand and immersed in each etchant at 35° C. for 150 seconds to perform etching. After that, it was washed with water and then dried with nitrogen gas.

The multilayer thin film sample including the copper layer and the titanium layer obtained by the above-described etching method was cut, and the cross section thereof was observed using a scanning electron microscope (model number: S5000H, manufactured by Hitachi, Ltd., 50000×) (accelerating voltage: 2 kV, accelerating current: 10 μA).

Based on the obtained SEM image, the taper angle 5 shown in FIG. 3 was measured, and the shape after etching was judged based on the below-described criteria.

Taper angle E: 60° or more but less than 70°
G: 50° or more but less than 60°
B: less than 50° or 70° or more
E and G were regarded as acceptable.

The evaluation results are shown in Tables 1 and 2.

TABLE 1

| | HEDP (A) | Phosphonic acid (B) | $H_2O_2$ (C) | $HNO_3$ (D) | Fluorine compound (E) | Azole (F) | Alkali compound (G) | Water | E.R. of IGZO (Å/sec) | Surface condition of IGZO | Taper angle |
|---|---|---|---|---|---|---|---|---|---|---|---|
| Example 1 | 0.05 | B1 (0.015) | 5.3 | 3.6 | E1 (0.38) | F1 (0.1) | G1 (2.77) | Remaining amount | E (3.9) | E | E (64°) |
| Example 2 | 0.05 | B2 (0.015) | 5.3 | 3.6 | E1 (0.38) | F1 (0.1) | G1 (2.77) | Remaining amount | E (2.3) | E | E (60°) |
| Example 3 | 0.05 | B3 (0.015) | 5.3 | 3.6 | E1 (0.38) | F1 (0.1) | G1 (2.77) | Remaining amount | G (5.5) | G | E (60°) |
| Example 4 | 0.05 | B1 (0.015) | 5.3 | 3.6 | E1 (0.38) | F1 (0.1) | G2 (1.97) | Remaining amount | E (2.5) | E | E (65°) |
| Example 5 | 0.05 | B1 (0.015) | 5.3 | 4 | E1 (0.38) | F1 (0.1) | G3 (4.12) | Remaining amount | E (2.9) | E | G (50°) |
| Example 6 | 0.05 | B1 (0.015) | 5.3 | 3.6 | E1 (0.38) | F1 (0.1) | G4 (0.60) | Remaining amount | E (3.1) | E | G (54°) |
| Example 7 | 0.05 | B1 (0.015) | 5.3 | 3.6 | E1 (0.38) | F1 (0.1) | G5 (4.20) | Remaining amount | E (3.0) | E | G (56°) |
| Example 8 | 0.05 | B1 (0.015) + B3 (0.015) | 5.3 | 3.6 | E1 (0.38) | F1 (0.1) | G1 (2.77) | Remaining amount | E (3.1) | E | E (65°) |
| Example 9 | 0.01 | B1 (0.015) | 5.3 | 3.6 | E1 (0.38) | F1 (0.1) | G1 (2.77) | Remaining amount | E (1.3) | E | E (60°) |
| Example 10 | 0.1 | B1 (0.015) | 5.3 | 3.6 | E1 (0.38) | F1 (0.1) | G1 (2.77) | Remaining amount | E (3.3) | E | E (61°) |
| Example 11 | 0.05 | B1 (0.005) | 5.3 | 3.6 | E1 (0.38) | F1 (0.1) | G1 (2.77) | Remaining amount | P (9.2) | E | E (61°) |
| Example 12 | 0.05 | B1 (0.03) | 5.3 | 3.6 | E1 (0.38) | F1 (0.1) | G1 (2.77) | Remaining amount | E (1.0) | G | G (56°) |

TABLE 2

| | HEDP (A) | Phosphonic acid (B) | $H_2O_2$ (C) | $HNO_3$ (D) | Fluorine compound (E) | Azole (F) | Alkali compound (G) | Water | E.R. of IGZO | Surface condition of IGZO | Taper angle |
|---|---|---|---|---|---|---|---|---|---|---|---|
| Comparative Example 1 | — | — | 5.3 | 3.6 | E1 (0.38) | F1 (0.1) | G1 (2.77) | Remaining amount | B (36) | B | B (44°) |
| Comparative Example 2 | 0.05 | — | 5.3 | 3.6 | E1 (0.38) | F1 (0.1) | G1 (2.77) | Remaining amount | P (9.4) | B | E (60°) |
| Comparative Example 3 | — | B1 (0.015) | 5.3 | 3.6 | E1 (0.38) | F1 (0.1) | G1 (2.77) | Remaining amount | P (8.6) | B | G (56°) |
| Comparative Example 4 | 0.05 | B4 (0.015) | 5.3 | 3.6 | E1 (0.38) | F1 (0.1) | G1 (2.77) | Remaining amount | B (29) | B | B (47°) |
| Comparative Example 5 | 0.05 | B5 (0.015) | 5.3 | 3.6 | E1 (0.38) | F1 (0.1) | G1 (2.77) | Remaining amount | B (25) | B | B (48°) |
| Comparative Example 6 | 0.05 | B6 (0.015) | 5.3 | 3.6 | E1 (0.38) | F1 (0.1) | G1 (2.77) | Remaining amount | E (2.0) | E | *1 |
| Comparative Example 7 | 0.05 | B1 (0.015) | 5.3 | Sulfuric acid (3.4) | E1 (0.38) | F1 (0.1) | G1 (2.77) | Remaining amount | G (6.6) | B | B (75°) |
| Comparative Example 8 | 0.05 | B1 (0.015) | 5.3 | B4 (3.6) | E1 (0.38) | F1 (0.1) | G1 (2.77) | Remaining amount | | *2 | |
| Comparative Example 9 | 0.2 | B1 (0.015) | 5.3 | 3.6 | E1 (0.38) | F1 (0.1) | G1 (2.77) | Remaining amount | G (5.7) | B | E (65°) |
| Comparative Example 10 | 0.005 | B1 (0.015) | 5.3 | 3.6 | E1 (0.38) | F1 (0.1) | G1 (2.77) | Remaining amount | P (8.8) | B | G (57°) |
| Comparative Example 11 | 0.05 | B1 (0.05) | 5.3 | 3.6 | E1 (0.38) | F1 (0.1) | G1 (2.77) | Remaining amount | E (0.3) | E | *3 |
| Comparative Example 12 | 0.05 | B1 (0.001) | 5.3 | 3.6 | E1 (0.38) | F1 (0.1) | G1 (2.77) | Remaining amount | P (8.4) | B | G (57°) |

*1: it was impossible to make evaluation due to the generation of etching unevenness.
*2: Ti was not dissolved in the test liquid (untestable).
*3: it was impossible to carry out the measurement due to excessive tailing.

Note that the components in the tables are as described below.
B 1: N,N,N',N'-ethylenediaminetetrakismethylenephosphonic acid
B2: diethylenetriaminepentamethylenephosphonic acid
B3: aminotrimethylenephosphonic acid
B4: phosphoric acid
B5: phosphonic acid
B6: pentaethylene octamethylenephosphonic acid
E1: ammonium acid fluoride
F1: 5-amino-1H-tetrazole
G1: quaternary ammonium hydroxide
G2: potassium hydroxide
G3: N-butylethanolamine
G4: ammonia
G5: 1-amino-2-propanol

REFERENCE SIGNS LIST 1 resist layer
2 wiring layer
3 barrier layer
4 IGZO layer
5 taper angle
a top CD loss (a×2)
b bottom CD loss (b×2)
c tailing (c×2)

INDUSTRIAL APPLICABILITY

The etchant of the present invention can be suitably used for etching of a wring material of a substrate including IGZO. According to a preferred embodiment of the present invention, a substrate having a wiring structure with a high taper angle can be produced while preventing the corrosion of IGZO.

The invention claimed is:
1. An etchant, comprising:
hydroxyethanediphosphonic acid (A),
a phosphonic acid (B),
hydrogen peroxide (C),
nitric acid (D),
a fluorine compound (E),
an azole (F), and
an alkali (G),
wherein:
the phosphonic acid (B) comprises at least one phosphonic acid selected from the group consisting of diethylenetriaminepentamethylenephosphonic acid, N,N,N',N'-ethylenediaminetetrakismethylenephosphonic acid, and aminotrimethylenephosphonic acid;
the ratio of the hydroxyethanediphosphonic acid (A) is 0.01 to 0.1% by mass; and
the ratio of the phosphonic acid (B) is 0.003 to 0.04% by mass, each relative to a total mass of the etchant.
2. The etchant of claim 1, wherein the phosphonic acid (B) is diethylenetriaminepentamethylenephosphonic acid.
3. The etchant of claim 1, wherein the fluorine compound (E) is ammonium fluoride or ammonium acid fluoride.
4. The etchant of claim 1, wherein the phosphonic acid (B) is at least one phosphonic acid selected from the group consisting of diethylenetriaminepentamethylenephosphonic acid, N,N,N',N'-ethylenediaminetetrakismethylenephosphonic acid.
5. The etchant of claim 1, wherein the ratio of the phosphonic acid (B) in the etchant is 0.01 to 0.03% by mass.
6. The etchant of claim 1, wherein the ratio of the fluorine compound (E) in the etchant is 0.2 to 0.8% by mass.
7. The etchant of claim 1, wherein the ratio of the hydrogen peroxide (C) in the etchant is 4.0 to 8.0% by mass.
8. The etchant of claim 1, wherein the ratio of the nitric acid (D) in the etchant is 0.8 to 7.0% by mass.
9. The etchant of claim 1, wherein the azole (F) is 5-amino-1H-tetrazole.
10. The etchant of claim 1, wherein the ratio of the azole (F) in the etchant is 0.05 to 0.35% by mass.
11. The etchant of claim 1, wherein the alkali (G) is at least one alkali selected from the group consisting of ammonia, potassium hydroxide, quaternary ammonium hydroxide, and an amine compound.
12. The etchant of claim 1, wherein the alkali (G) is at least one alkali selected from the group consisting of ammonia, potassium hydroxide, quaternary ammonium hydroxide, N-butylethanolamine and 1-amino-2-propanol.
13. The etchant of claim 1, wherein the ratio of the alkali (G) in the etchant is 0.6 to 10% by mass.
14. The etchant of claim 1, wherein the etching rate at 35° C. of indium gallium zinc oxide, in which the element ratio between indium (In), gallium (Ga), zinc (Zn) and oxygen (O) is 1:1:1:4, is lower than 10 Å/sec when 6000 ppm of copper and 150 ppm of titanium are dissolved in the etchant.
15. A method for etching a substrate comprising indium gallium zinc oxide (IGZO), the method comprising:
contacting the substrate with the etchant of claim 1.
16. A method for etching a wiring material formed on a substrate comprising indium gallium zinc oxide (IGZO), the method comprising:
contacting the substrate and the wiring material with the etchant of claim 1.
17. A method for etching a barrier layer and a wiring layer formed on a substrate comprising indium gallium zinc oxide (IGZO), the method comprising:
contacting the substrate, the wiring layer, and the barrier layer with the etchant of claim 1.
18. A process for producing a display device, comprising:
etching a wiring material formed on a substrate by contacting the substrate and the wiring material with the etchant of claim 1,
wherein the substrate comprises indium gallium zinc oxide (IGZO).
19. A process for producing a display device, comprising:
etching a barrier layer and a wiring layer formed on a substrate by contacting the barrier layer, the wiring layer, and the substrate with the etchant of claim 1,
wherein the substrate comprises indium gallium zinc oxide (IGZO).

* * * * *